United States Patent [19]
Hanawa et al.

[11] Patent Number: 5,938,837
[45] Date of Patent: Aug. 17, 1999

[54] CERIUM OXIDE ULTRAFINE PARTICLES AND METHOD FOR PREPARING THE SAME

[75] Inventors: Kenzo Hanawa; Naoyoshi Mochizuki; Naruo Ueda, all of Saitama, Japan

[73] Assignee: Mitsui Mining and Smelting Co., Ltd., Tokyo, Japan

[21] Appl. No.: 08/719,618

[22] Filed: Sep. 25, 1996

[30] Foreign Application Priority Data

Nov. 20, 1995 [JP] Japan ..................................... 7-325143

[51] Int. Cl.⁶ ....................................................... C30B 7/00
[52] U.S. Cl. ............................... 117/68; 117/70; 117/944; 423/213.2
[58] Field of Search ............................... 117/68, 70, 944; 423/213.2

[56] References Cited

U.S. PATENT DOCUMENTS

| | | |
|---|---|---|
| 4,784,026 | 11/1988 | Kobayashi et al. . |
| 4,786,325 | 11/1988 | Melard et al. . |
| 5,017,352 | 5/1991 | Chane-Ching et al. . |
| 5,035,834 | 7/1991 | Chane-Ching et al. . |
| 5,080,877 | 1/1992 | Chane-Ching et al. . |
| 5,693,299 | 12/1997 | Chopin et al. ........................ 423/213.2 |
| 5,712,218 | 1/1998 | Chopin et al. .......................... 502/304 |

*Primary Examiner*—Robert Kunemund
*Attorney, Agent, or Firm*—Young & Thompson

[57] ABSTRACT

Cerium oxide ultrafine particles consist essentially of cerium oxide single crystal grains having a grain size ranging from 10 to 80 nm and the cerium oxide ultrafine particles can be prepared by a method which comprises the steps of mixing, with stirring, an aqueous solution of cerous nitrate with a base in such a mixing ratio that the pH value of the mixture ranges from 5 to 10, then rapidly heating the resulting mixture up to a temperature of 70 to 100° C. and maturing the mixture at that temperature. The cerium oxide ultrafine particles not only have an average particle size ranging from 10 to 80 nm, but also are uniform in the particle size and in the shape.

18 Claims, 3 Drawing Sheets

CERIUM OXIDE ULTRAFINE PARTICLES AND METHOD FOR PREPARING THE SAME

BACKGROUND OF THE INVENTION (a) Field of the Invention

The present invention relates to cerium oxide ultrafine particles and a method for preparing the same and more particularly to single crystal cerium oxide ultrafine particles which can be used as a polishing agent for flattening and finishing the surface of, for instance, glass, quartz, silicon and tungsten materials, electroless-plated nickel/phosphorus layers or films and hardmetal materials.

The polishing agent comprising such cerium oxide ultrafine particles can be used in various fields, for instance, production of optical elements such as lenses; production of electronic materials for constituting display elements such as cathode-ray tubes and liquid crystal elements; production of parts such as photomasks for constituting electronic device-manufacturing apparatuses; production of parts for recording information such as hard disks; and production of semiconductor elements, for instance, silicon wafer-processing and planation processing employed in the course of IC-manufacturing processes.

(b) Description of the Prior Art

Cerium oxide fine particles have mainly been used as carriers for catalysts and polishing agents for polishing glass materials and must satisfy different characteristic properties depending on the application.

When using the cerium oxide fine particles as carriers for catalysts, they must have a high specific surface area, a large pore volume and a large pore diameter and these requirements should likewise be maintained as much as possible even at a high temperature. For instance, U.S. Pat. No. 5,017,352 discloses ceric oxide having a specific surface area of not less than 85±5 $m^2/g$ after firing at a temperature ranging from 350 to 450° C. and preferably having a specific surface area falling within the range of from 100 to 130 $m^2/g$ after firing at a temperature ranging from 400 to 450° C.; The oxide is prepared by hydrolyzing an aqueous ceric nitrate solution in an aqueous nitric acid solution, separating precipitates formed, washing the precipitates, optionally drying them and then firing the same at a temperature ranging from 300 to 600° C.

In addition, U.S. Pat. No. 4,784,026 discloses ceric oxide having a specific surface area of not less than 85±5 $m^2/g$ after firing at a temperature ranging from 350 to 500° C. and preferably having a specific surface area falling within the range of from 150 to 180 $m^2/g$ after firing at a temperature ranging from 400 to 450° C.; This oxide is prepared by reacting an aqueous ceric nitrate solution with a sulfate ion-containing aqueous solution to thus precipitate basic ceric sulfate particles, separating the precipitates thus formed, washing the particles, optionally drying them and then firing the same at a temperature ranging from 300 to 500° C.

Further, U.S. Pat. No. 5,035,834 discloses an intermediate for use in the preparation of the foregoing fine particulate cerium oxide as well as a method for preparing the intermediate. The intermediate is a cerium(IV) compound represented by the general formula: $Ce(OH)_x(NO_3)_y \cdot pCeO_2 \cdot nH_2O$ (in the formula, x is a numerical value satisfying the relation: x=4−y; y is a numerical value ranging from 0.35 to 1.5; p is not less than 0 and not more than 2.0; and n is not less than 0 and not more than about 20) and the method for preparing the intermediate comprises the steps of hydrolyzing an aqueous cerium(IV) salt solution in an aqueous acidic solution, separating the resulting precipitates and optionally subjecting them to a heat-treatment. The intermediate shows the same X-ray diffraction pattern as that observed for $CeO_2$, but the firing loss thereof is found to be 20%. Moreover, the intermediate turns to cerium oxide having a large specific surface area by firing.

All of the cerium oxide powdery products prepared by the foregoing methods have a very small crystalline grain size on the order of about 5 Å as determined by the X-ray diffractometry. In addition, they have a large specific surface area, more specifically, a specific surface area of not less than 85±5 $m^2/g$ and generally not less than 100 $m^2/g$, but the particle size thereof is on the order of about 0.5 to 2 μm and the particles have micropores of about 50 Å

Cerium oxide has been known to be most effective as a polishing agent for polishing glass materials and has widely been employed.

To polish glass materials such as lenses, there has generally been used a cerium oxide polishing agent prepared by firing a bastnasite ore which mainly comprises cerium carbonate and then finely pulverizing the fired product. Such a cerium oxide polishing agent practically used has an average particle size ranging from 1 to 3 μm and is inevitably contaminated with an uncontrollable amount of impurities since a naturally occurring ore is used as a starting material. For this reason, such a polishing agent cannot be used in the semiconductor device-manufacturing processes.

There have been known methods for preparing highly pure cerium oxide which comprise the steps of adding a salt of, for instance, carbonic acid, oxalic acid or acetic acid to an aqueous solution of, for instance, purified cerous nitrate, cerous chloride or cerous sulfate to thus form precipitates of a corresponding product (such as cerous carbonate, cerous oxalate or cerous acetate); filtering the precipitates; drying them; and then firing the dried precipitates. The oxide of Ce(III) is in general unstable and cannot actually exist in the air. For this reason, cerium oxide can actually exist only in the form of $CeO_2$. In these production methods, acid moieties such as carbonic acid, oxalic acid or acetic acid are released from the dried precipitates during the firing step as the temperature increases to thus give cerium oxide. In this respect, holes are formed at positions from which the acid moieties are released and this leads to the formation of particles having a quite low degree of crystallization. The cerium oxide having a low degree of crystallization has high chemical reactivity and when such cerium oxide is used as a polishing agent, it suffers from various problems such as burning, formation of orange peel and adhesion on the surface of a subject to be polished. Consequently, such cerium oxide cannot be used in precision polishing. For this reason, the firing temperature used in the foregoing methods should further be increased. If the firing temperature is further increased, the foregoing holes are collapsed and the crystallinity of the particles is improved, while sintering of the particles simultaneously proceeds and this in turn leads to a gradual increase in the particle size. In this regard, fine particulate cerium oxide having an average particle size ranging from 20 to 80 nm can be obtained by finely pulverizing such sintered particles having a large particle size if disregarding the particle size distribution, and therefore, the pulverized cerium oxide can be used in the semiconductor device-manufacturing processes depending on purposes. In applications wherein the polished surface requires quite strict accuracy, the particles must be uniform in particle size. However, it is impossible to obtain particles which are uniform in particle size, by pulverization of large particles.

U.S. Pat. No. 4,786,325 proposes a method capable of making the particle size uniform, which comprises the steps of continuously supplying and simultaneously mixing an aqueous cerium nitrate solution and an aqueous ammonia solution in such a manner that the equivalent amount of ammonia is not less than that of cerium and that the pH of the solution is maintained at a level of not less than 6 to thus form precipitates; filtering off the resulting precipitates; drying them; firing the dried precipitates at a temperature ranging 600 to 1200° C.; and then pulverizing the resulting oxide by using a jet mill. In this method, when cerous nitrate is employed, an aqueous hydrogen peroxide solution is added to convert it into ceric nitrate and it is an essential requirement that the reaction system comprises a solution of a salt of at least one trivalent rare earth element selected from the group consisting of lanthanides and yttrium in amount of 0.5 to 60%, in addition to ceric nitrate in amount of 40 to 99.5%. Moreover, the average particle size of the resulting oxide ranges from 0.5 to 1.7 μm and therefore, the oxide cannot also be used in applications wherein the polished surface requires quite strict accuracy.

Incidentally, the particle size of fine particles has often been correlated with the specific surface area thereof, in the field of ceramics and the correlation between them can be expressed by the following equation:

Specific Surface Area $(m^2/g) = 3/r\rho$ wherein r represents the diameter (μm) of the particles and ρ means the density (g/ml) thereof.

However, the foregoing relation does not hold for any material including a large number of fine pores in the internal parts of the body. For example, the cerium oxide prepared by the production method developed while keeping, in mind, the application of the oxide as a catalyst, naturally has a large number of fine pores in the internal parts of the body and thus has a large specific surface area and therefore, the particles have a true particle size on the order of 1 μm even if they have a corresponding particle size of not more than 5 nm, which is calculated from the specific surface area according to the equation defined above.

The required particle size of polishing agents may vary depending on various applications, but the higher the desired accuracy for finished surface (surface accuracy) after polishing, the smaller the particle size of the polishing agents. For instance, the polishing agent used in the semiconductor device-manufacturing processes must have a particle size ranging from 10 to 80 nm and should be uniform in the particle size. More specifically, when interlayer insulating films are polished in a semiconductor device-manufacturing process, the surface accuracy achieved after the polishing should be about 5 Å as expressed in terms of the average surface roughness and the polishing agent should have a particle size of not more than 80 nm in order to fulfill the foregoing requirement. In addition, the polishing rate tends to decrease in proportion to the reduction of the particle size of the polishing agent used. For this reason, if the particle size is less than 10 nm, cerium oxide loses its advantage such that cerium oxide is superior in the polishing rate to the colloidal silica. Moreover, the polishing agent should be uniform in the particle size as much as possible in order to achieve a high degree of flatness. Accordingly, the polishing agent to be used in the semiconductor device-manufacturing processes must not only have an average particle size ranging from 10 to 80 nm, but also be uniform in the particle size.

Moreover, the polishing agent particles are preferably uniform in shape in order to ensure a desired degree of flatness. In this regard, the particles are approximately uniform in shape if they are formed from single crystals and such a polishing agent permits the achievement of an extremely high degree of flatness.

It has been known that cerium oxide can ensure the fastest polishing rate in polishing processing of silicon oxides such as quartz substrate. In addition, interlayer insulating films are formed from silicon oxide in many cases and therefore, cerium oxide would be most desirably used as a polishing agent for interlayer insulating films in order to achieve the fastest polishing rate. However, the polishing agent used for processing interlayer insulating films must in general satisfy highly strict requirements for the degree of flatness and for the surface accuracy achieved after the polishing. At present, colloidal silica is the only polishing agent whose particle size ranges from 10 to 80 nm and which has a narrow particle size distribution and it has accordingly been used in the polishing processing of interlayer insulating films, but the colloidal silica does not have a desired high polishing rate and cannot provide a sufficiently high operating efficiency. For this reason, there has been an intense desire for the development of cerium oxide whose particle size ranges from 10 to 80 nm and which has a narrow particle size distribution.

SUMMARY OF THE INVENTION

Accordingly, it is an object of the present invention to provide cerium oxide ultrafine particles whose particle size ranges from 10 to 80 nm and which are uniform in not only the particle size, but also the shape.

Another object of the present invention is to provide a method for preparing the foregoing cerium oxide ultrafine particles.

If an aqueous solution of a cerium(IV) salt is maintained at a temperature of 100° C. under an acidic condition, precipitates of cerium hydroxide represented by the formula: $Ce(OH)_4$ are formed. If $Ce(OH)_4$ is once formed, however, it cannot converted into cerium Qxide till it is subsequently subjected to steps of filtration, drying and firing. On the contrary, if cerium oxide is directly prepared through a reaction in an aqueous solution without any firing step, the resulting cerium oxide particles should be cerium oxide ultrafine particles having excellent dispersibility and uniform particle size. Therefore, the inventors of this invention have intensively investigated this idea. As a result, the inventors have found out that ultrafine cerium oxide single crystal grains having a particle size ranging from 10 to 80 nm can be obtained by mixing, with stirring, an aqueous solution of cerous nitrate with a base in a mixing ratio such that the pH value of the mixture ranges from 5 to 10 and then maintaining the mixture at a temperature ranging from 70 to 100° C. and thus have completed the present invention.

According to an aspect of the present invention, there is provided ultrafine cerium oxide particles (or grains) comprising cerium oxide single crystal grains having a particle size ranging from 10 to 80 nm.

According to another aspect of the present invention, there is provided a method for preparing cerium oxide ultrafine particles comprising cerium oxide single crystal grains having a particle size ranging from 10 to 80 nm, which comprises the steps of mixing, with stirring, an aqueous solution of cerous nitrate with a base in such a mixing ratio that the pH value of the mixture ranges from 5 to 10, then rapidly heating the resulting mixture up to a temperature ranging from 70 to 100° C. and then maintaining the mixture at that temperature.

PREFERRED EMBODIMENTS OF THE INVENTION

Figure 1:
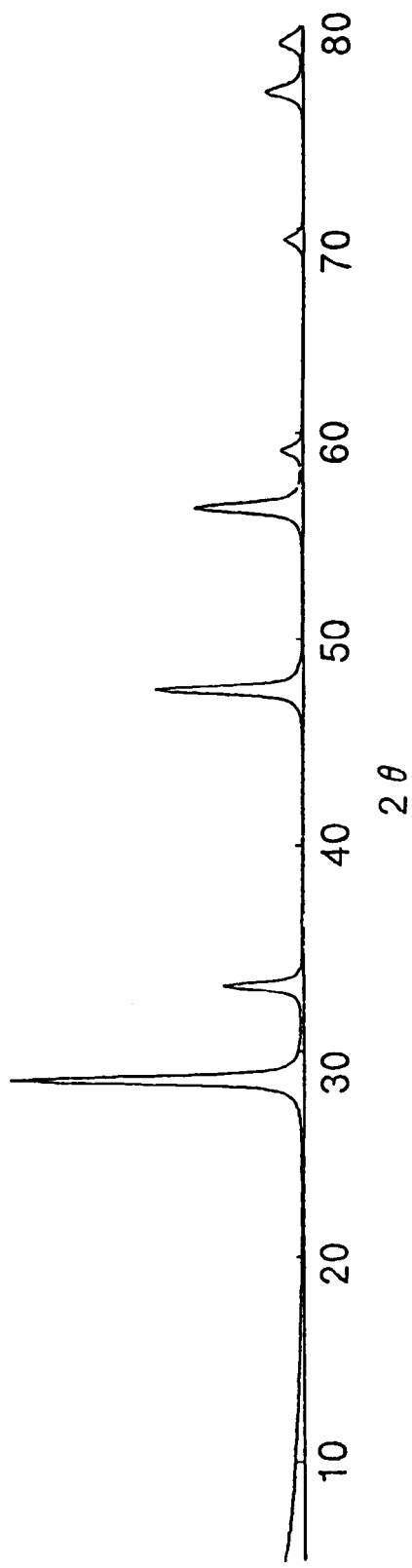
FIG. 1 is an X-ray diffraction pattern observed for the cerium oxide particles prepared in Example 1.

The cerium oxide ultrafine particles of the present invention consist essentially of cerium oxide single crystal grains having a grain size ranging from 10 to 80 nm and preferably 20 to 60 nm. In the present invention, the particle size is limited to the range of from 10 to 80 nm. The reason for this is as follows. First, the particle size should be adjusted to not more than 80 nm in order to ensure the surface roughness achieved after the polishing of about 5 Å, while the cerium oxide particles having a particle size of less than 10 nm are insufficient in the polishing rate, since the smaller the particle size, the lower the polishing rate. Moreover, the cerium oxide particles of the present invention consist essentially of single crystal grains of cerium oxide. Therefore, the cerium oxide particles are almost uniform not only in the particle size, but also in the shape and permit the achievement of a considerably highly precise flatness.

Although examples of cerium(III) compounds include cerous nitrate, cerous chloride and cerous sulfate, the intended purpose of the present invention can be accomplished only by the use of cerous nitrate. Therefore, an aqueous cerous nitrate solution is used in the method for preparing the cerium oxide ultrafine single crystal particles. The concentration of the aqueous cerous nitrate solution is not restricted to a particular range, but the use of an extremely low concentration is not preferred because of low production efficiency. Moreover, an almost saturated aqueous solution thereof can likewise be used in the invention without any trouble.

Any known base may be used in the method of the present invention to form cerium oxide single crystal grains having a desired particle size ranging from 10 to 80 nm. In this respect, however, the use of hydroxides of alkali metals or alkaline earth metals as the bases results in the contamination of the final cerium oxide products with impurities such as corresponding alkali metals or alkaline earth metals. Such impurity-containing cerium oxide cannot be used as a polishing agent in the semiconductor device-manufacturing processes. For this reason, aqueous ammonia is preferably used as the base and this leads to cerium oxide single crystal grains substantially free of such undesired impurities.

In the method of the present invention, an aqueous cerous nitrate solution and a base, preferably aqueous ammonia are first admixed with stirring in such a mixing ratio that the resulting mixture has a pH ranging from 5 to 10. It is critical in the present invention to restrict the pH of the resulting mixture to the range of from 5 to 10 since the desired cerium oxide single crystal grains are formed by simply maintaining the mixture having such a specific pH at a temperature ranging from 70 to 100° C. More specifically, if the pH of the mixture is less than 5, cerium hydroxide is soluble and cerium oxide is not formed, while if it exceeds 10, cerium hydroxide formed is stabilized and this leads to the reduction of the amount of cerium oxide. For this reason, the pH value of the mixture is limited to the range of from 5 to 10 and preferably 7 to 9 in the method of the present invention.

Subsequent to the mixing, with stirring, the aqueous solution of cerous nitrate and the base, the mixed solution is rapidly heated up to a temperature ranging from 70 to 100° C. and then maintained at that temperature. If the mixed solution is heated after allowing it to stand over a long time period or the mixture is gradually heated up to the temperature defined above, the desired cerium oxide single crystals having a particle size ranging from 10 to 80 nm are formed only in a poor yield or, in the worst case, the desired cerium oxide cannot be formed. Accordingly, in the second step of the production method of the invention, the resulting mixture of the aqueous solution of cerous nitrate and the base is rapidly (preferably within 10 minutes) heated up to a maturing temperature ranging from 70 to 100° C. This is because if the maturing temperature is less than 70° C., the maturing requires a very long time period and therefore, the use of such a temperature is impractical. On the other hand, the use of an autoclave is required in order to increase the maturing temperature to a level of more than 100° C. Therefore, the maturing is preferably carried out in the open air from the economical point of view. More preferably, the maturing is carried out by boiling the mixture under reflux at 100° C. In this connection, cerium oxide can of course be prepared by maturing the mixture at a temperature of more than 100° C. using an autoclave, but the resulting product has a particle size of more than 100 nm.

The maturing time varies depending on the concentration of the cerium compound used and the maturing temperature. The higher the concentration thereof, the shorter the required maturing time. In addition, the higher the maturing temperature, the shorter the required maturing time or vice versa. In the method of the present invention, the maturing time preferably ranges from about 0.2 to 20 hours and more preferably about 0.5 to 10 hours.

In the method of this invention, cerium(III) hydroxide is simultaneously dehydrated and oxidized to cerium(IV) during the maturing at a temperature ranging from 70 to 100° C. The oxygen required for the oxidation process is present in the aqueous solution and supplied from nitrate ions. No problem arises due to the presence of cerium(IV) in the aqueous cerous nitrate solution. However, cerium(IV) results in the formation of $Ce(OH)_4$ and the latter is not dehydrated during the maturing. Accordingly, the amount of cerium(IV) contaminating the reaction system is desirably not more than 5%.

The particle size of the resulting cerium oxide can be controlled by the mixing speed of the aqueous cerous nitrate solution with the base, preferably aqueous ammonia. If these two components are immediately mixed together by continuously introducing them into a small-sized tank provided with a means for high speed stirring or a static mixer, cerium oxide particles having a small particle size (ranging from 10 to 20 nm) can be obtained after the maturing. On the other hand, if aqueous ammonia is gradually added to the aqueous cerous nitrate solution, cerium oxide particles having a large particle size are obtained after the maturing. Therefore, cerium oxide particles having a desired particle size falling within the range of from 10 to 80 nm can be prepared by carrying out the addition of aqueous ammonia in two stages while appropriately adjusting the amount of aqueous ammonia to be added in each stage and the time required for the addition.

The desired cerium oxide single crystal ultrafine particles are formed at the end of the maturing and therefore, any firing step can be omitted in the method of the invention. This slurry is washed to remove the nitrate ions and ions of the base such as ammonium ions. The washing may be carried out by repeating decantation, repulsing technique or using a rotary filter press which can be referred to as continuous repulping device or a fine powder-washing device which makes use of a ceramic filter, a hollow fiber membrane or an ultrafiltration membrane.

The slurry obtained after the washing, as such, is preferably used as a polishing agent. Alternatively, the slurry may be once dried, subjected to a deagglomeration treatment, if necessary, and again dispersed in water to give a slurry immediately before the practical use, like the conventional polishing agents for glass. The drying step is preferably carried out using a slurry dryer such as a vacuum dryer or a spray dryer in order to inhibit the formation of any agglomeration due to drying.

As has been discussed above in detail, the cerium oxide ultrafine particles according to the present invention consist essentially of cerium oxide single crystal grains. Therefore, the cerium oxide ultrafine particles not only have an average particle size ranging from 10 to 80 nm, but also are uniform in the particle size and in the shape.

In addition, in the production method of the present invention, cerium oxide single crystal ultrafine particles are formed at the end of the maturing and accordingly, the product obtained after the maturing is not subjected to any firing step. Therefore, the ultrafine particles of the present invention can likewise be used in applications wherein the surface to be processed requires considerably strict accuracy.

The present invention will hereinafter be described in more detail with reference to the following non-limitative working Examples, but the present invention is not restricted to these specific Examples.

EXAMPLE 1

There were prepared 20 l, of a 1M aqueous cerous nitrate solution and 20 l of a 3M aqueous ammonia. These two solutions were simultaneously introduced into a 60 l volume container and the resulting mixture was stirred at 500 rpm using a stirring machine. The pH value of the liquid mixture was found to be 9. After stirring for 5 minutes, steam was injected into the container to raise the temperature of the mixture up to 100° C. within 3 minutes and the temperature thereof was maintained at 100° C. for one hour. Thereafter the nitrate ions and the ammonium ions were removed by repeating decantation 5 times to thus give a cerium oxide particle-containing slurry.

Figure 2:
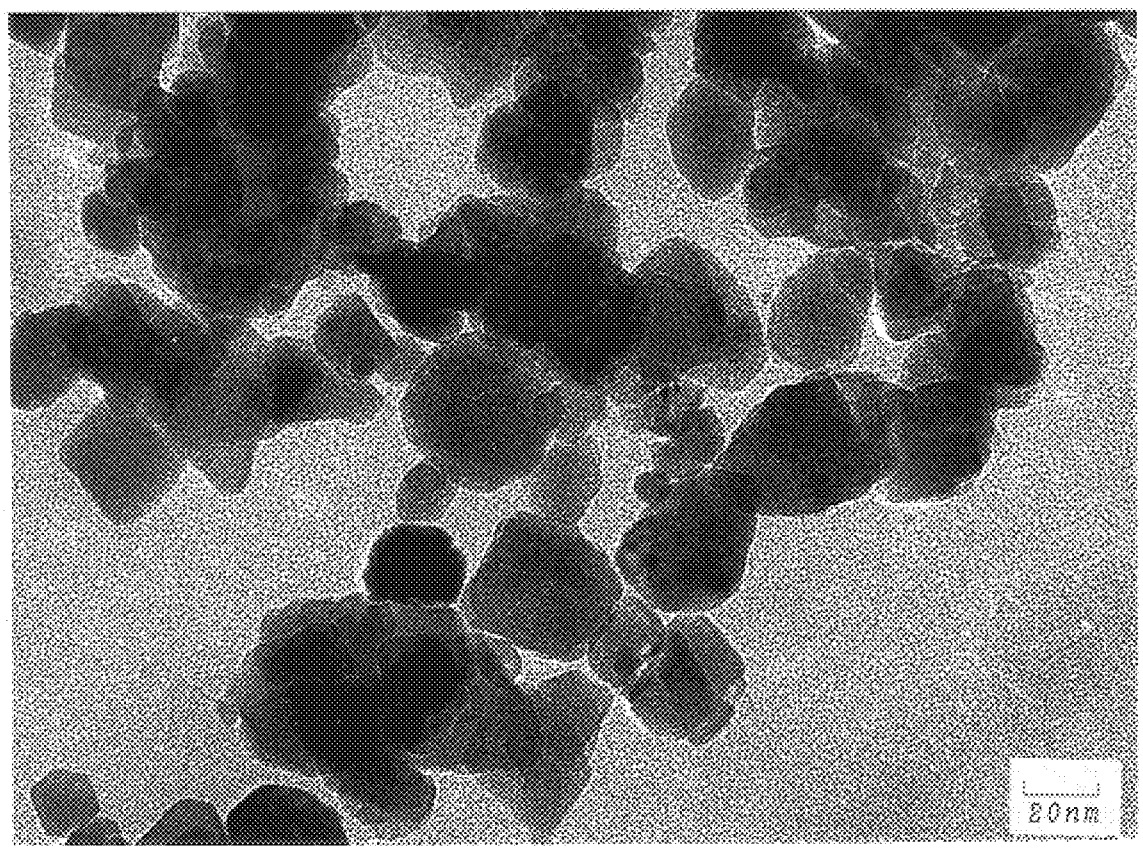
FIG. 2 is a TEM photograph of the cerium oxide particles prepared in Example 1.

The slurry thus prepared was filtered and dried to obtain the cerium oxide particles which were then analyzed by the X-ray diffractometry. The result thus obtained is shown in FIG. 1. The crystal grain size was determined by the following equation on the basis of the half-width and found to be 20 nm:

$$B = 0.9\lambda / (t \cos \theta)$$

wherein B represents the half-width (nm), λ represents the wavelength of X-ray, t represents the crystal grain size and θ represents the diffraction angle. See B. D.Cullity, "Elements of X-Ray Diffraction" (1956) Addison-Wesley Publishing Company, Inc. Chapter 9. In addition, the resulting cerium oxide particles were subjected to deagglomeration, then observed by TEM (magnifying power: 500,000) and the resulting TEM photograph is shown in FIG. 2. The results shown in FIG. 2 clearly indicate that the cerium oxide ultrafine particles are monodispersed particles which are uniform in particle size and whose average particle size is about 20 nm. These particles were found to have a specific surface area of about 23 m²/g and a corresponding particle size of about 20 nm as calculated on the basis of the specific surface area. Moreover, these particles were heated to 300° C. to determine the weight loss thereof and as a result, it was found to be 1.3%. Each particle would consist of a single crystal grain since the crystal grain size as determined by the X-ray diffractometry, the particle size as observed by the TEM and that calculated from the specific surface area are approximately consistent with one another.

EXAMPLE 2

The same procedures used in Example 1 were repeated except that the maturing temperature and the maturing time were changed to 70° C. and 10 hours, respectively. The results obtained were approximately identical to those observed in Example 1.

EXAMPLE 3

To a 60 l volume container, there was added 20 l of a 1M aqueous cerous nitrate solution and 20 l of a 3M aqueous ammonia was gradually added thereto over 6 hours while stirring the content of the container at 500 rpm using a stirring machine. After the completion of the addition, the pH value of the liquid mixture was found to be 8. Then water vapor was injected into the container to raise the temperature of the mixture up to 100° C. within 3 minutes and the temperature thereof was maintained at 100° C. for one hour. Thereafter the nitrate ions and the ammonium ions were removed by repeating decantation 5 times to thus give a cerium oxide particle-containing slurry.

The slurry thus prepared was filtered and dried to obtain the cerium oxide particles which were then analyzed by the X-ray diffractometry. As a result, the X-ray diffraction pattern thereof was almost identical to that observed in Example 1. The crystal grain size was determined from the half-width and found to be 50 nm and the particle size determined by the TEM observation was also found to be 50 nm. These particles were found to have a specific surface area of about 10 m²/g and a corresponding particle size calculated from the specific surface area was also found to be 50 nm.

COMPARATIVE EXAMPLE 1

The same procedures used in Example 1 were repeated except that cerous chloride was substituted for the cerous nitrate used in Example 1.

Figure 3:
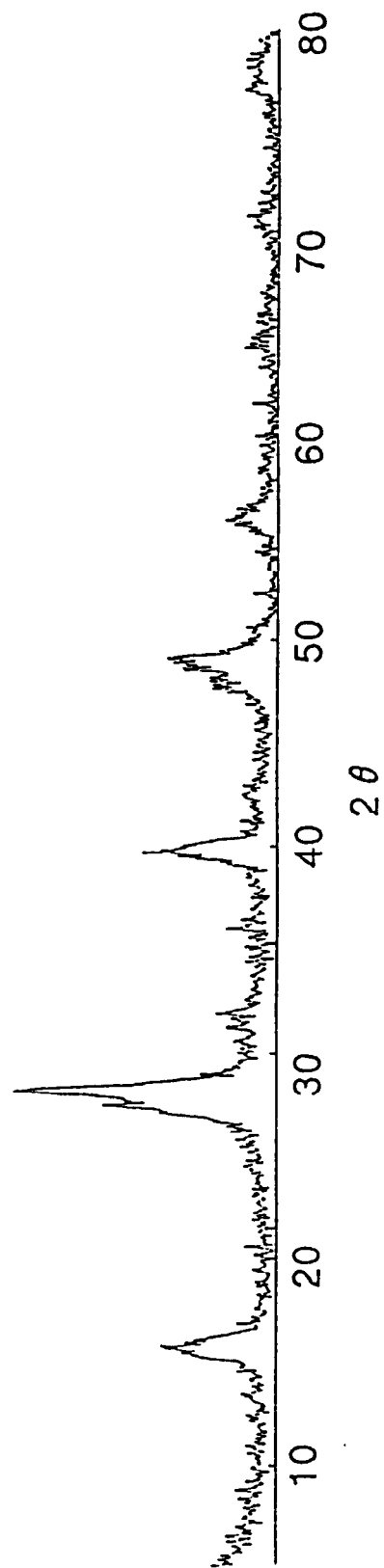
FIG. 3 is an X-ray diffraction pattern observed for the cerium oxide particles prepared in Comparative Example 1.

The powder thus prepared was analyzed by the X-ray diffractometry and the results are shown in FIG. 3. The peaks appearing on FIG. 3 are those ascribed to cerous hydroxide and there was not observed any peak to be ascribed to cerium oxide.

COMPARATIVE EXAMPLE 2

The same procedures used in Example 1 were repeated except that the maturing temperature and the maturing time were changed to 60° C. and 24 hours, respectively. It was found that the resulting powder mainly comprised cerous hydroxide.

COMPARATIVE EXAMPLE 3

The same procedures used in Example 1 were repeated except that the maturing time was changed to 10 minutes.

The X-ray diffraction pattern of the resulting powder indicates that it mainly comprises ceric hydroxide. Moreover the peaks are very broad and thus the particle size could not be determined. In addition, the particle size could not likewise be determined by the TEM observation. When the powder was heated to 300° C., it underwent a weight loss of 20%. Consequently, the powder is considered to be water-containing ceric hydroxide.

What is claimed is:

1. Cerium oxide ultrafine particles consisting essentially of cerium oxide single crystal grains having a grain size ranging from 10 to 80 nm.

2. The cerium oxide ultrafine particles of claim 1 wherein the grain size ranges from 20 to 60 nm.

3. A method for preparing cerium oxide ultrafine particles which consist essentially of cerium oxide single crystal grains having a particle size ranging from 10 to 80 nm, comprising the steps of mixing, with stirring, an aqueous solution of cerous nitrate with a base in such a mixing ratio that the pH value of the mixture ranges from 5 to 10, then rapidly heating the resulting mixture up to a temperature of 70 to 100° C., and maturing the mixture of cerous nitrate with a base at that temperature to form said grains.

4. The method of claim 3 wherein the base is aqueous ammonia.

5. The method of claim 4 wherein the pH value of the mixture ranges from 7 to 9.

6. The method of claim 3 wherein the step of rapidly heating up to a temperature ranging from 70 to 100° C. is carried out within 10 minutes.

7. The method of claim 3 wherein the maturing is carried out over 0.2 to 20 hours.

8. The method of claim 3 wherein the base is aqueous ammonia and the pH value of the mixture ranges from 7 to 9.

9. The method of claim 3 wherein the base is aqueous ammonia and the the step of rapidly heating up to a temperature ranging from 70 to 100° C. is carried out within 10 minutes.

10. The method of claim 3 wherein the pH value of the mixture ranges from 7 to 9 and the step of rapidly heating up to a temperature ranging from 70 to 100° C. is carried out within 10 minutes.

11. The method of claim 3 wherein the base is aqueous ammonia and the maturing time is over 0.2 to 20 hours.

12. The method of claim 3 wherein the pH value of the mixture ranges from 7 to 9 and the maturing time is over 0.2 to 20 hours.

13. The method of claim 3 wherein the step of rapidly heating up to a temperature ranging from 70 to 100° C. is carried out within 10 minutes and the maturing time is over 0.2 to 20 hours.

14. The method of claim 3 wherein the base is aqueous ammonia, the pH value of the mixture ranges from 7 to 9 and the step of rapidly heating up to a temperature ranging from 70 to 100° C. is carried out within 10 minutes.

15. The method of claim 3 wherein the base is aqueous ammonia, the pH value of the mixture ranges from 7 to 9 and the maturing time is over 0.2 to 20 hours.

16. The method of claim 3 wherein the base is aqueous ammonia, the step of rapidly heating up to a temperature ranging from 70 to 100° C. is carried out within 10 minutes and the maturing time is over 0.2 to 20 hours.

17. The method of claim 4 wherein the pH value of the mixture ranges from 7 to 9, the step of rapidly heating up to a temperature ranging from 70 to 100° C. is carried out within 10 minutes and the maturing time is over 0.2 to 20 hours.

18. The method of claim 3 wherein the base is aqueous ammonia, the pH value of the mixture ranges from 7 to 9, the step of rapidly heating up to a temperature ranging from 70 to 100° C. is carried out within 10 minutes and the maturing time is over 0.2 to 20 hours.

* * * * *